United States Patent
Liang et al.

(10) Patent No.: US 9,431,132 B2
(45) Date of Patent: Aug. 30, 2016

(54) DATA MANAGING METHOD, MEMORY CONTROL CIRCUIT UNIT AND MEMORY STORAGE APPARATUS

(71) Applicant: PHISON ELECTRONICS CORP., Miaoli (TW)

(72) Inventors: Li-Chun Liang, Kaohsiung (TW); Kuo-Hsin Lai, Hsinchu County (TW); Pei-Yu Shih, Taipei (TW); Tien-Ching Wang, Kaohsiung (TW)

(73) Assignee: PHISON ELECTRONICS CORP., Miaoli (TW)

( * ) Notice: Subject to any disclaimer, the term of this patent is extended or adjusted under 35 U.S.C. 154(b) by 232 days.

(21) Appl. No.: 14/307,509

(22) Filed: Jun. 18, 2014

(65) Prior Publication Data

US 2015/0331742 A1 Nov. 19, 2015

(30) Foreign Application Priority Data

May 13, 2014 (TW) .............................. 103116868 A

(51) Int. Cl.
| | |
|---|---|
| G11C 29/00 | (2006.01) |
| *G11C 29/52* | (2006.01) |
| *G06F 11/10* | (2006.01) |
| G11B 20/18 | (2006.01) |
| G11C 29/04 | (2006.01) |

(52) U.S. Cl.
CPC ........... *G11C 29/52* (2013.01); *G06F 11/1012* (2013.01); *G06F 11/1068* (2013.01); *G06F 11/1076* (2013.01); *G06F 11/106* (2013.01); *G11B 20/1833* (2013.01); *G11C 2029/0411* (2013.01)

(58) Field of Classification Search
CPC ........... G06F 11/1068; G06F 11/1076; G06F 11/1056; G06F 11/106; G11C 29/52; G11B 20/1833

USPC ................................ 714/763, 764, 781, 785
See application file for complete search history.

(56) References Cited

U.S. PATENT DOCUMENTS

| | | | | |
|---|---|---|---|---|
| RE30,187 E | | 1/1980 | Hong et al. | |
| 4,949,342 A | * | 8/1990 | Shimbo ................. | H03M 13/15 714/769 |
| 5,563,896 A | * | 10/1996 | Nakaguchi .............. | G06F 11/10 714/763 |
| 2007/0204199 A1 | * | 8/2007 | Chung ................. | G06F 11/1008 714/763 |
| 2007/0271494 A1 | * | 11/2007 | Gorobets ............ | G06F 11/1068 714/763 |
| 2008/0301256 A1 | * | 12/2008 | McWilliams ....... | G06F 12/0284 709/214 |

(Continued)

OTHER PUBLICATIONS

"Office Action of Taiwan Counterpart Application", issued on Oct. 22, 2015, p. 1-p. 11.

*Primary Examiner* — Albert Decady
*Assistant Examiner* — Osman M Alshack
(74) *Attorney, Agent, or Firm* — Jianq Chyun IP Office

(57) ABSTRACT

A data managing method, and a memory control circuit unit and a memory storage apparatus using the same are provided. The data managing method including: reading a first data stream from a first physical erasing unit according to a first reading command, wherein the first data stream includes first user data, a first error correcting code and a first error detecting code. The method also includes: using the first error correcting code and error detecting code to decode the first user data and determining whether the first user data is decoded successfully. The method further includes: if the first user data is decoded successfully, transmitting corrected user data obtained by correctly decoding the first user data to the host system in response to the first reading command.

12 Claims, 6 Drawing Sheets

(56) References Cited

U.S. PATENT DOCUMENTS

2009/0113272 A1* 4/2009 Tan ................... G06F 11/1052
            714/765

2009/0222643 A1* 9/2009 Chu ................... G06F 12/0246
            711/209
2013/0246887 A1* 9/2013 Torii ................... H03M 13/09
            714/758

* cited by examiner

DATA MANAGING METHOD, MEMORY CONTROL CIRCUIT UNIT AND MEMORY STORAGE APPARATUS

CROSS-REFERENCE TO RELATED APPLICATION

This application claims the priority benefit of Taiwan application serial no. 103116868, filed on May 13, 2014. The entirety of the above-mentioned patent application is hereby incorporated by reference herein and made a part of this specification.

BACKGROUND

1. Technical Field

The present invention relates to a data managing method, and particularly relates to a dada managing method for a rewritable non-volatile memory, and a memory control circuit unit and a memory storage apparatus using the method.

2. Related Art

In recent years, digital cameras, mobile phones and MP3 players are quickly developed, and consumer's demand on storage media is also increased rapidly. Since a rewritable non-volatile memory module (for example, a flash memory) has characteristics of non-volatile, power-saving, small volume and none mechanical structure, etc., it is adapted to be built in the above various portable multimedia devices.

Along with progress of manufacturing process and cost reduction, memory storage capacity is greatly increased, though data reliability is decreased, and an error correcting code is used to improve the data reliability. Generally, when data is written into the rewritable non-volatile memory module, the data is encoded by an error checking and correcting circuit to generate a corresponding error correcting code. A corresponding decoding procedure is performed to the data read from the rewritable non-volatile memory module, so as to correct an error bit in the read data by using the error correcting code. Conventionally, the error correcting code applied to a NAND flash memory is generated according to a Bose-Chaudhuri-hocquenghem (BCH) algorithm. However, along with increase of the memory capacity, a total time required for correctly decoding data is accordingly increased. Therefore, how to decrease the time required for decoding data to improve decoding efficiency is an important issue concerned by technicians of the field.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention is directed to a dada managing method, and a memory control circuit unit and a memory storage apparatus using the method, by which an operation time required for decoding data is decreased, so as to improve a data reading efficiency.

According to an exemplary embodiment of the present invention, a data managing method for a rewritable non-volatile memory module is provided, where the rewritable non-volatile memory module includes a plurality of physical erasing units and is configured with a plurality of logic units for mapping to at least a part of the physical erasing units. The data managing method include receiving a first reading command from a host system, where the first reading command indicates to read data from a first logic unit among the logic units, and the first logic unit is mapped to a first physical erasing unit among the physical erasing units. The data managing method also includes reading a first data stream from the first physical erasing unit, where the first data stream includes first user data, a first error detecting code and a first error correcting code. The data managing method still includes using the first error detecting code, the first error correcting code and the first user data to perform a first decoding procedure; in the first decoding procedure, performing a logic operation on the first error detecting code and a first error bit location of the first user data generated in the first decoding procedure; and when a result of the logic operation is complied with a predetermined rule, stopping the first decoding procedure; identifying the first user data is successfully decoded; and when the first user data is successfully decoded, transmitting corrected user data obtained by successfully decoding the first user data to the host system in response to the first reading command.

The present invention provides a memory control circuit unit for controlling a rewritable non-volatile memory module. The memory control circuit unit includes a host interface, a memory interface and a memory managing circuit. The host interface is configured to couple to a host system. The memory interface is configured to couple to the rewritable non-volatile memory module. The rewritable non-volatile memory module has a plurality of physical erasing units. The memory managing circuit is coupled to the host interface and the memory interface, and configures a plurality of logic units for mapping to at least a part of the physical erasing units, where the memory managing circuit receives a first reading command from the host system, where the first reading command indicates to read data from a first logic unit among the logic units, and the first logic unit is mapped to a first physical erasing unit among the physical erasing units. The memory managing circuit sends a command sequence to read a first data stream from the first physical erasing unit, where the first data stream includes first user data, a first error detecting code and a first error correcting code. Moreover, the memory managing circuit performs a first decoding procedure by using the first error detecting code, the first error correcting code and the first user data. In addition, in the first decoding procedure, the memory managing circuit performs a logic operation by using the first error detecting code and a first error bit location of the first user data generated in the first decoding procedure, and stops the first decoding procedure when a result of the logic operation is complied with a predetermined rule, and identifies that the first user data is successfully decoded. When the first user data is successfully decoded, the memory managing circuit transmits corrected user data obtained by successfully decoding the first user data to the host system to respond the first reading command.

The present invention provides a memory storage apparatus including a connection interface unit, a rewritable non-volatile memory module and a memory control circuit unit. The connection interface unit is configured to couple to a host system. The rewritable non-volatile memory module has a plurality of physical erasing units. The memory control circuit unit is coupled to the connection interface unit and the rewritable non-volatile memory module, and configures a plurality of logic units for mapping to at least a part of the physical erasing units, where the memory control circuit unit receives a first reading command from the host system, the first reading command indicates to read data from a first logic unit among the logic units, and the first logic unit is mapped to a first physical erasing unit among the physical erasing units. Moreover, the memory control circuit unit sends a command sequence to read a first data stream from the first physical erasing unit, where the first data stream includes first user data, a first error detecting code and a first error correcting code. Moreover, the memory control circuit unit performs a first decoding procedure by using the first error detecting code, the first error correcting code and the first user data. In addition, in the first decoding procedure, the memory control circuit unit performs a logic operation by using the first error detecting code and a first error bit location of the first user data generated in the first decoding procedure, and stops the first decoding procedure when a result of the logic operation is complied with a predetermined rule, and identifies that the first user data is successfully decoded. When the first user data is successfully decoded, the memory control circuit unit transmits corrected user data obtained by successfully decoding the first user data to the host system to respond the first reading command.

According to the above descriptions, the error detecting code is used to strengthen data protection, and when it is detected that the decoded data is correct by using the error detecting code, the decoding flow of the whole error correcting code is ended in advance without detecting whether the read data is correctable, by which a decoding speed is accelerated to enhance a data reading efficiency.

In order to make the aforementioned and other features and advantages of the invention comprehensible, several exemplary embodiments accompanied with figures are described in detail below.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
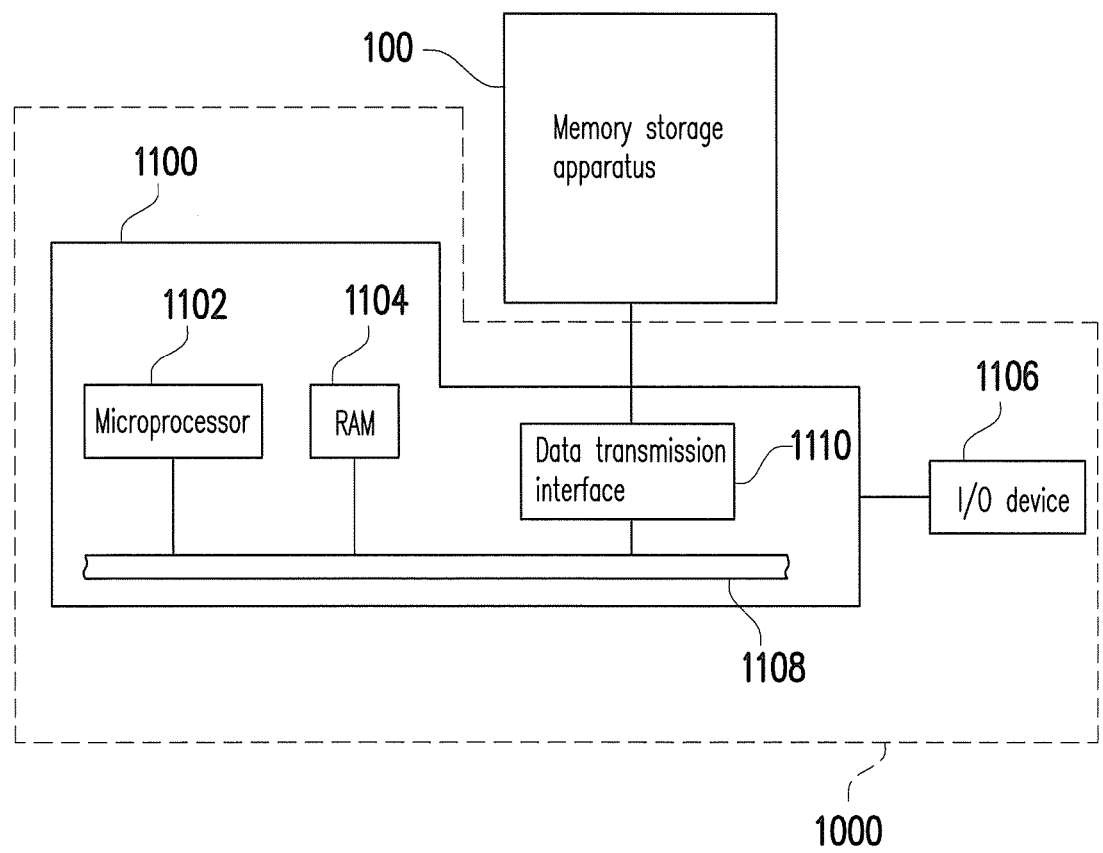
FIG. 1 is a schematic diagram of a host system and a memory storage apparatus according to an exemplary embodiment.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage apparatus (which is also referred to as a memory storage system) includes a rewritable non-volatile memory module and a controller (which is also referred to as a control circuit). The memory storage apparatus is generally used together with a host system, and the host system can write data into the memory storage apparatus and read data from the memory storage apparatus.

Figure 2:
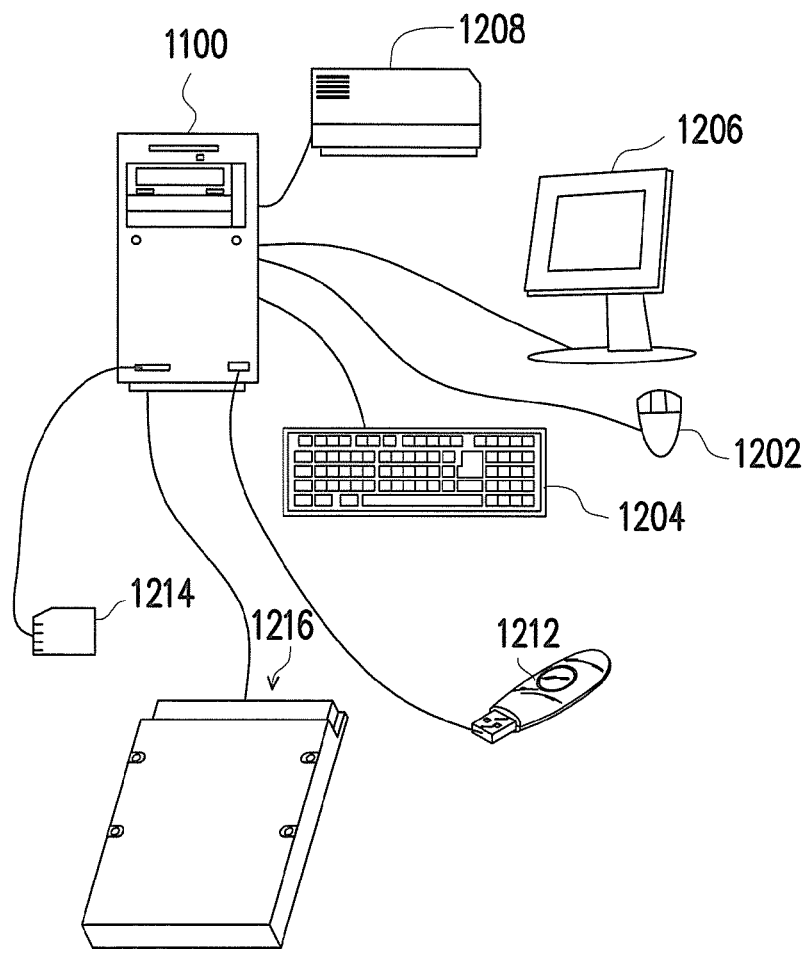
FIG. 2 is a schematic diagram of a computer, an input/output device and a memory storage apparatus according to an exemplary embodiment.

FIG. 1 is a schematic diagram of a host system and a memory storage apparatus according to an exemplary embodiment, and FIG. 2 is a schematic diagram of a computer, an input/output device and a memory storage apparatus according to an exemplary embodiment.

Referring to FIG. 1, the host system 1000 generally includes a computer 1100 and an input/output (I/O) device 1106. The computer 1100 includes a microprocessor 1102, a random access memory (RAM) 1104, a system bus 1108 and a data transmission interface 1110. The I/O device 1106 includes a mouse 1202, a keyboard 1204, a display 1206 and a printer 1208 as shown in FIG. 2. It should be noticed that the devices shown in FIG. 2 are not used to limit the I/O device 1106, and the I/O device 1106 may further include other devices.

In the present embodiment, the memory storage apparatus 100 is coupled to the components of the host system 1000 through the data transmission interface 1110. Based operations of the microprocessor 1102, the RAM 1104 and the I/O device 1106, data can be written into the memory storage apparatus 100 or the data is read from the memory storage apparatus 100. For example, the memory storage apparatus 100 can be a rewritable non-volatile memory storage apparatus such as a flash drive 1212, a memory card 1214 or a solid state drive (SSD) 1216, etc. shown in FIG. 2.

Figure 3:
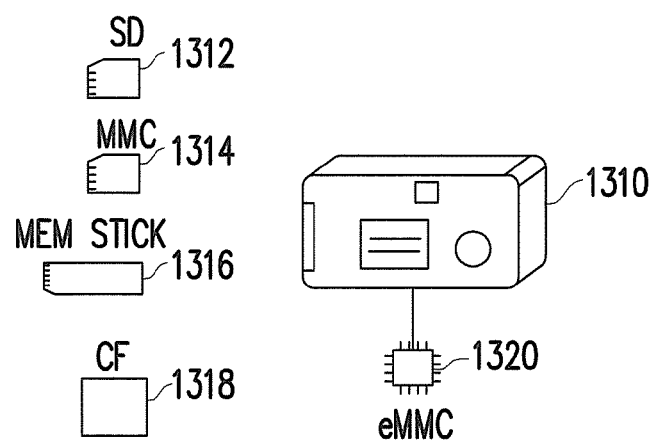
FIG. 3 is a schematic diagram of a host system and a memory storage apparatus according to an exemplary embodiment.

FIG. 3 is a schematic diagram of a host system and a memory storage apparatus according to an exemplary embodiment.

Generally, the host system 1000 is any system capable of operating together with the memory storage apparatus 100 to store data. In the present exemplary embodiment, although the host system 1000 implemented by the computer system is taken as an example for descriptions, in another exemplary embodiment of the invention, the host system 1000 can be a digital camera, a video camera, a communication device, an audio player or a video player, etc. For example, when the host system is a digital camera (a video camera) 1310, the rewritable non-volatile memory storage apparatus is a secure digital (SD) card 1312, a multimedia card (MMC) card 1314, a memory stick (MS) 1316, a compact flash (CF) card 1318, or an embedded storage device 1320 (shown in FIG. 3) used in the digital camera 1310. The embedded storage device 1320 includes an embedded MMC (eMMC). It should be noticed that the eMMC is directly coupled to a substrate of the host system.

Figure 4:
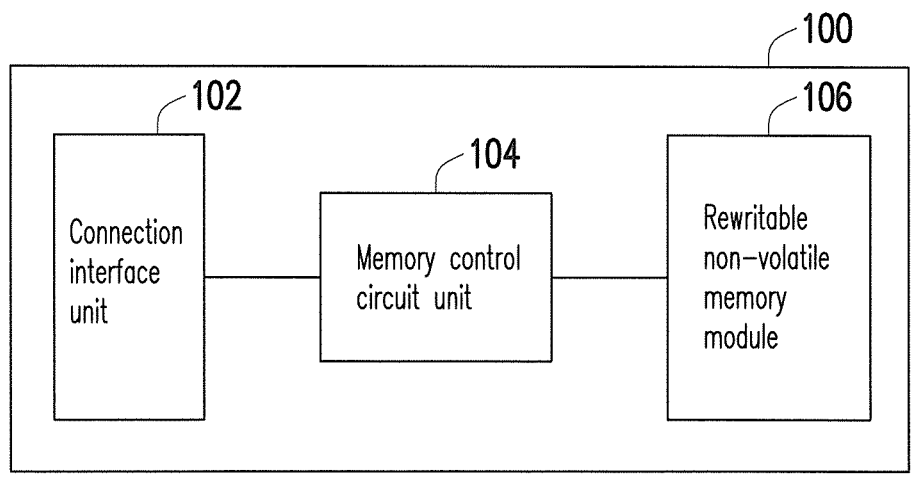
FIG. 4 is a schematic block diagram of the memory storage apparatus of FIG. 1.

FIG. 4 is a schematic block diagram of the memory storage apparatus of FIG. 1.

Referring to FIG. 4, the memory storage apparatus 100 includes a connection interface unit 102, a memory control circuit unit 104 and a rewritable non-volatile memory module 106.

In the present exemplary embodiment, the connection interface unit 102 is complied with a serial advanced technology attachment (SATA) standard. However, it should be noticed that the invention is not limited thereto, and the connection interface unit 102 can also be complied with a parallel advanced technology attachment (PATA) standard, an institute of electrical and electronic engineers (IEEE) 1394 standard, a peripheral component interconnect express (PCI express) standard, a universal serial bus (USB) standard, a secure digital (SD) interface standard, an ultra high speed-I (UHS-I) interface standard, an ultra high speed-II (UHS-II) interface standard, a memory stick (MS) interface standard, a multimedia card (MMC) interface standard, an embedded multimedia card (eMMC) interface standard, a universal flash storage (UFS) interface standard, a compact flash (CF) interface standard, an integrated device electronics (IDE) standard or other suitable standards. The connection interface unit 102 and the memory control circuit unit 104 can be packaged in one chip, or the connection interface unit 102 is allocated outside a chip containing the memory control circuit unit 104.

The memory control circuit unit 104 may execute a plurality of logic gates or control instructions implemented in a hardware form or a firmware form, and may perform a writing operation, a reading operation or an erasing operation to the rewritable non-volatile memory module 106 according to commands of the host system 1000.

The rewritable non-volatile memory module 106 is coupled to the memory control circuit unit 104 for storing data written by the host system 1000. The rewritable non-volatile memory module 106 can be a single level cell (SLC) NAND flash memory module, a multi level cell (MLC) NAND flash memory module (i.e. a flash memory module with one cell storing data of 2 bits), a triple level cell (TLC) NAND flash memory module (i.e. a flash memory module with one cell storing data of 3 bits), other flash memory modules or other memory modules having the same characteristic.

Figure 5:
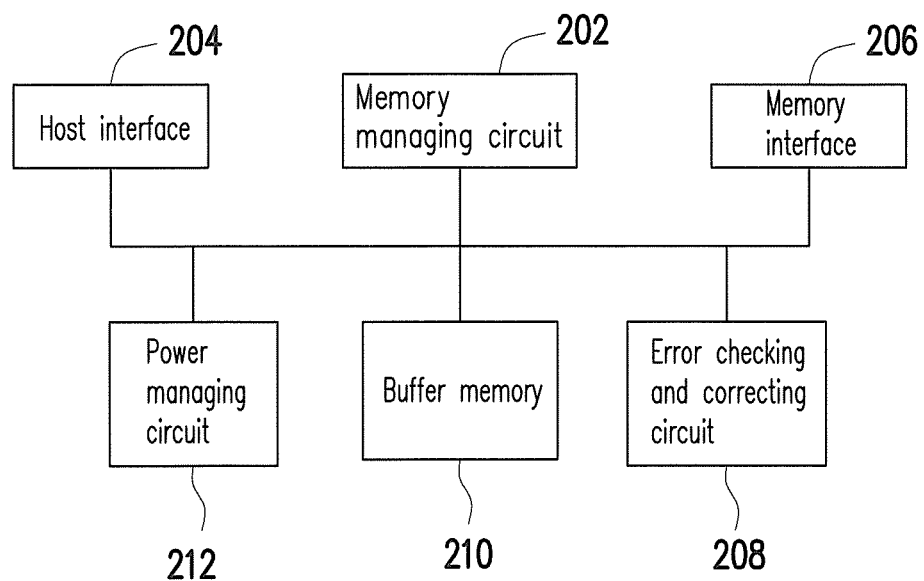
FIG. 5 is a schematic block diagram of a memory control circuit unit according to an exemplary embodiment.

FIG. 5 is a schematic block diagram of a memory control circuit unit according to an exemplary embodiment. It should be noticed that the structure of the memory control circuit unit of FIG. 5 is only an example, and the present invention is not limited thereto.

Referring to FIG. 5, the memory control circuit unit 104 includes a memory managing circuit 202, a host interface 204, a memory interface 206 and an error checking and correcting circuit 208.

The memory managing circuit 202 is configured to control a whole operation of the memory control circuit unit 104. In detail, the memory managing circuit 202 has a plurality of control instructions, and when the memory storage apparatus 100 is power-on, these control instructions are executed to implement data writing, reading and erasing operations, etc.

In the present exemplary embodiment, the control instructions of the memory managing circuit 202 are implemented in a firmware form. For example, the memory managing circuit 202 has a micro processing unit (not shown) and a read-only memory (not shown), and these control instructions are burned in the read-only memory. When the memory storage apparatus 100 operates, these control instructions are executed by the micro processing unit to implement the data writing, reading and erasing operations, etc.

In another exemplary embodiment, the control instructions of the memory managing circuit 202 may also be stored in a specific area (for example, a system area used for storing system data in the memory module) of the rewritable non-volatile memory module as program codes. Moreover, the memory managing circuit 202 has a micro processing unit (not shown), a read-only memory (not shown) and a random access memory (RAM) (not shown). Particularly, the read-only memory has a boot code, and when the memory control circuit unit 104 is enabled, the micro processing unit first runs the boot code to load the control instructions stored in the rewritable non-volatile memory module 106 to the RAM of the memory managing circuit 202. Then, the micro processing unit executes these control instructions to implement the data writing, reading and erasing operations, etc.

Moreover, in another exemplary embodiment of the present invention, the control instructions of the memory managing circuit 202 may also be implemented in a hardware form. For example, the memory managing circuit 202 includes a micro controller, a cell managing circuit, a memory writing circuit, a memory reading circuit, a memory erasing circuit and a data processing circuit. The cell managing circuit, the memory writing circuit, the memory reading circuit, the memory erasing circuit and the data processing circuit are coupled to the micro controller. The cell managing circuit is used for managing physical blocks of the rewritable non-volatile memory module 106. The memory writing circuit is used for sending a writing command to the rewritable non-volatile memory module 106 to write data into the rewritable non-volatile memory module 106. The memory reading circuit is used for sending a reading command to the rewritable non-volatile memory module 106 to read data from the rewritable non-volatile memory module 106. The memory erasing circuit is used for sending an erase command to the rewritable non-volatile memory module 106 to erase data in the rewritable non-volatile memory module 106. The data processing circuit is used for processing data to be written into the rewritable non-volatile memory module 106 and data read from the rewritable non-volatile memory module 106.

The host interface 204 is coupled to the memory management circuit 202, and is configured to receive and recognize commands and data transmitted by the host system 1000. Namely, the commands and data transmitted by the host system 1000 are transmitted to the memory managing circuit 202 through the host interface 204. In the present exemplary embodiment, the host interface 204 is complied with the SATA standard. However, the present invention is not limited thereto, and the host interface 204 can also be complied with the PATA standard, the IEEE 1394 standard, the PCI express standard, the USB standard, the SD standard, the UHS-I standard, the MS standard, the MMC standard, the eMMC standard, the UFS standard, the CF standard, the IDE standard or other suitable data transmission standards.

The memory interface 206 is coupled to the memory managing circuit 202 and is configured to access the rewritable non-volatile memory module 106. Namely, data to be written into the rewritable non-volatile memory module 106 is converted into a format that can be accepted by the rewritable non-volatile memory module 106 through the memory interface 206.

The error checking and correcting circuit 208 is coupled to the memory managing circuit 202 and is used for executing an error checking and correcting procedure to ensure correctness of data. In detail, in the present exemplary embodiment, when the memory managing circuit 202 (or the memory control circuit unit 104) receives a writing command and data corresponding to the writing command from the host system 1000, the error checking and correcting circuit 208 generates an error correcting code (ECC) for the data corresponding to the writing command by using a Bose-Chaudhuri-Hocquenghem (BCH) error correcting code, and performs a cyclic redundancy check (CRC) operation to generate an error detecting code (EDC) for the data corresponding to the writing command. Then, the memory managing circuit 202 (or the memory control circuit unit 104) writes the data corresponding to the writing command and the error correcting code, the error detecting code corresponding to the data to the rewritable non-volatile memory module 106. Then, when the memory managing circuit 202 (or the memory control circuit unit 104) reads data from the rewritable non-volatile memory module 106, the error correcting code and the error detecting code corresponding to the data are simultaneously read, and the error checking and correcting circuit 208 performs the error checking and correcting procedure on the read data according to the error correcting code and the error detecting code.

In brief, regarding usage of the BCH error correcting code, syndromes corresponding to the read data are calculated, and the syndromes are used to construct an error locator polynomial, and a root of the error locator polynomial is obtained to calculate a location of an error bit in the read data. Finally, a logic reverse calculation is performed on a bit value formed by the location of the error bit to correct the error, so as to obtain corrected data. For example, when the read data is 1111, and an error address corresponding to the read data is 0001, it represents that data of the first bit has an error, so that the logic reverse calculation is performed on the first bit of the read data to obtain the corrected data, and the corrected data obtained after the error correction is 1110 (111-1).

Figure 6:
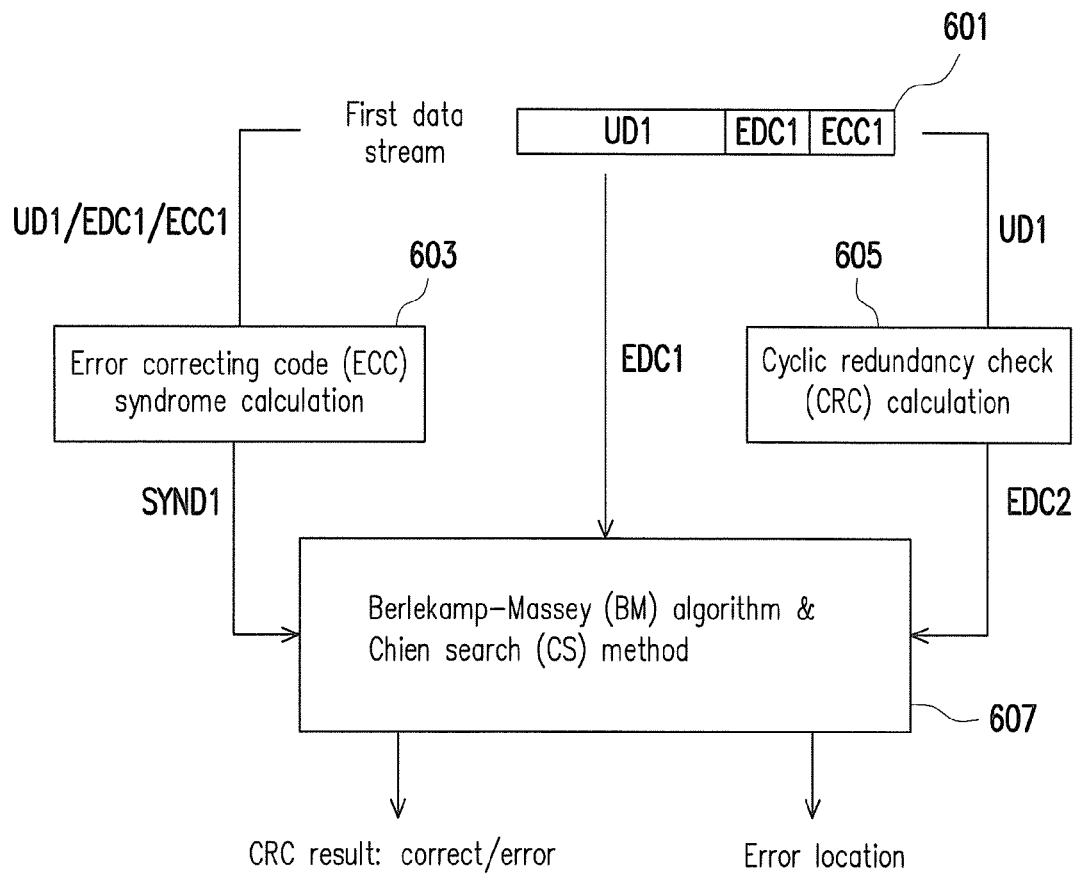
FIG. 6 is a structural diagram of a BCH error correcting code decoding algorithm according to an exemplary embodiment.

FIG. 6 is a structural diagram of a BCH error correcting code decoding algorithm according to an exemplary embodiment.

Referring to FIG. 6, for example, when a first reading command indicating to read data from one of a plurality of logic units (which is referred to as a first logic unit hereinafter) configured to the rewritable non-volatile memory module 106, the memory managing circuit 202 (or the memory control circuit unit 104) identifies the physical erasing unit (which is referred to as a first physical erasing unit hereinafter) mapped to the first logic unit. Then, the memory managing circuit 202 (or the memory control circuit unit 104) sends a command sequence to read a data stream 601 (which is referred to as a first data stream 601 hereinafter) from the first physical erasing unit of the rewritable non-volatile memory module 106. The first data stream 601, as described above, is a data set written into the first physical erasing unit after the BCH error correcting code encoding. Namely, the first data stream 601 includes data to be read (which is referred to as a first user data UD1 hereinafter), a first error detecting code EDC1 corresponding to the first user data UD1 and a first error correcting code ECC1. Then, the memory managing circuit 202 (or the memory control circuit unit 104) performs an ECC syndrome calculation 603 to the first data stream 601 to generate a first syndrome SYND1 corresponding to the first data stream. Meanwhile, the memory managing circuit 202 (or the memory control circuit unit 104) performs a CRC calculation 605 to the first user data UD1 to obtain a second error detecting code EDC2.

Then, in a block 607, the memory managing circuit 202 (or the memory control circuit unit 104) calculates an error locator polynomial (which is referred to as a first error locator polynomial) corresponding to the first data stream 601 according to the first syndrome SYND1 by using an algorithm such as a Berlekamp-Massey (BM) algorithm, an Inversionless Berlekamp-Massey algorithm or a Modified Euclidean algorithm or other similar algorithms, and calculates an error bit number (which is referred to as a first error bit number) of the first data stream 601. The memory managing circuit 202 (or the memory control circuit unit 104) uses another algorithm as an error location searching rule, for example, a Chien search (CS) method to find an error bit location. In detail, the memory managing circuit 202 (or the memory control circuit unit 104) uses the CS method to find an error bit location of the first user data UD1 first, and then find an error bit location of the first error detecting code EDC1, and finally find an error bit location of the first error correcting code ECC1. For example, the memory managing circuit 202 (or the memory control circuit unit 104) first finds the error bit location (which is referred to as the first error bit location) of the first user data UD1 according to the first syndrome SYND1, the first error locator polynomial and the CS method. Then, the memory managing circuit 202 (or the memory control circuit unit 104) performs the CRC calculation to the first error bit location to generate a third error detecting code corresponding to the first error bit location, and performs an XOR logic operation to the third error detecting code and the second error detecting code EDC2 to generate a fourth error detecting code. Moreover, the memory managing circuit 202 (or the memory control circuit unit 104) determines whether the fourth error detecting code is equal to the first error detecting code EDC1. If the fourth error detecting code is equal to the first error detecting code EDC1, it represents that the CRC result of the first user data UD1 is correct. If the fourth error detecting code is not equal to the first error detecting code EDC1, it represents that the CRC result of the first user data UD1 is wrong, and the memory managing circuit 202 (or the memory control circuit unit 104) outputs an error message to the host system.

If the CRC result of the first user data UD1 is correct, the memory managing circuit 202 (or the memory control circuit unit 104) is unnecessary to find the error bit location of the first error correcting code ECC1, and ends the CS method in advance to shorten a calculation time. Namely, if the CRC result of the first user data UD1 is correct, the memory managing circuit 202 (or the memory control circuit unit 104) performs the XOR logic operation on the first error bit location and the first user data UD1 to generate corrected user data without detecting whether the first data stream 601 is correctable, and transmits the corrected user data to the host system.

It should be noticed that in another exemplary embodiment, the memory managing circuit 202 (or the memory control circuit unit 104) first determines whether the first error bit number is greater than a predetermined error bit threshold after calculates the first error bit number. When the first error bit number is greater than the predetermined error bit threshold, it has a great chance that the first user data UD1 cannot be corrected, or it represents that the CRC result of the first user data UD1 obtained in the block 607 has an error. Therefore, when the first error bit number is greater than the predetermined error bit threshold, the memory managing circuit 202 (or the memory control circuit unit 104) does not end the CS method in advance, but continues a general correction flow. Namely, the memory managing circuit 202 (or the memory control circuit unit 104) continues to check whether the first data stream 601 is correctable, and performs the correction after determining that the error bit location of the whole first data stream 601 can be trusted. It should be noticed that, in the present exemplary embodiment, the predetermined error bit threshold can be set to a value of the maximum error bit protection capability of the error checking and correcting circuit 208 minus 1, though the present invention is not limited thereto.

In detail, in another exemplary embodiment, if the first error bit number is greater than the predetermined error bit threshold, after the memory managing circuit 202 (or the memory control circuit unit 104) uses the CS method to find the error bit location of the first error detecting code EDC1, the memory managing circuit 202 (or the memory control circuit unit 104) continues to find the error bit location of the first error correcting code ECC1 to obtain the error bit location of the whole first data stream 601. When the error bit location (which is referred to as a second error bit location hereinafter) of the whole first data stream 601 is obtained, the memory managing circuit 202 (or the memory control circuit unit 104) calculates the error bit number (which is referred to as a second error bit number) of the first data stream 601 according to the second error bit location. Then, the memory managing circuit 202 (or the memory control circuit unit 104) determines whether the second error bit number is equal to the first error bit number. When the second error bit number is equal to the first error bit number, it represents that the found error bit location can be trusted, and the memory managing circuit 202 (or the memory control circuit unit 104) identifies that the first data stream 601 is correctable. Then, the memory managing circuit 202 (or the memory control circuit unit 104) performs the XOR logic operation on the first user data UD1 and the second error bit location to generate the corrected user data.

In another exemplary embodiment, before the memory managing circuit 202 (or the memory control circuit unit 104) transmits the corrected user data to the host system, the memory managing circuit 202 (or the memory control circuit unit 104) performs the CRC calculation on the corrected user data to generate a fifth error detecting code corresponding to the corrected user data, and determines whether the fifth error detecting code is equal to the first error detecting code EDC1. If the fifth error detecting code is equal to the first error detecting code EDC1, it represents that the corrected user data is correctly corrected, and the memory managing circuit 202 (or the memory control circuit unit 104) transmits the corrected user data to the host system. If the fifth error detecting code is not equal to the first error detecting code EDC1, it represents that the corrected user data is not correctly corrected, and the memory managing circuit 202 (or the memory control circuit unit 104) does not transmit the corrected user data, and outputs an error message to the host system.

Figure 7:
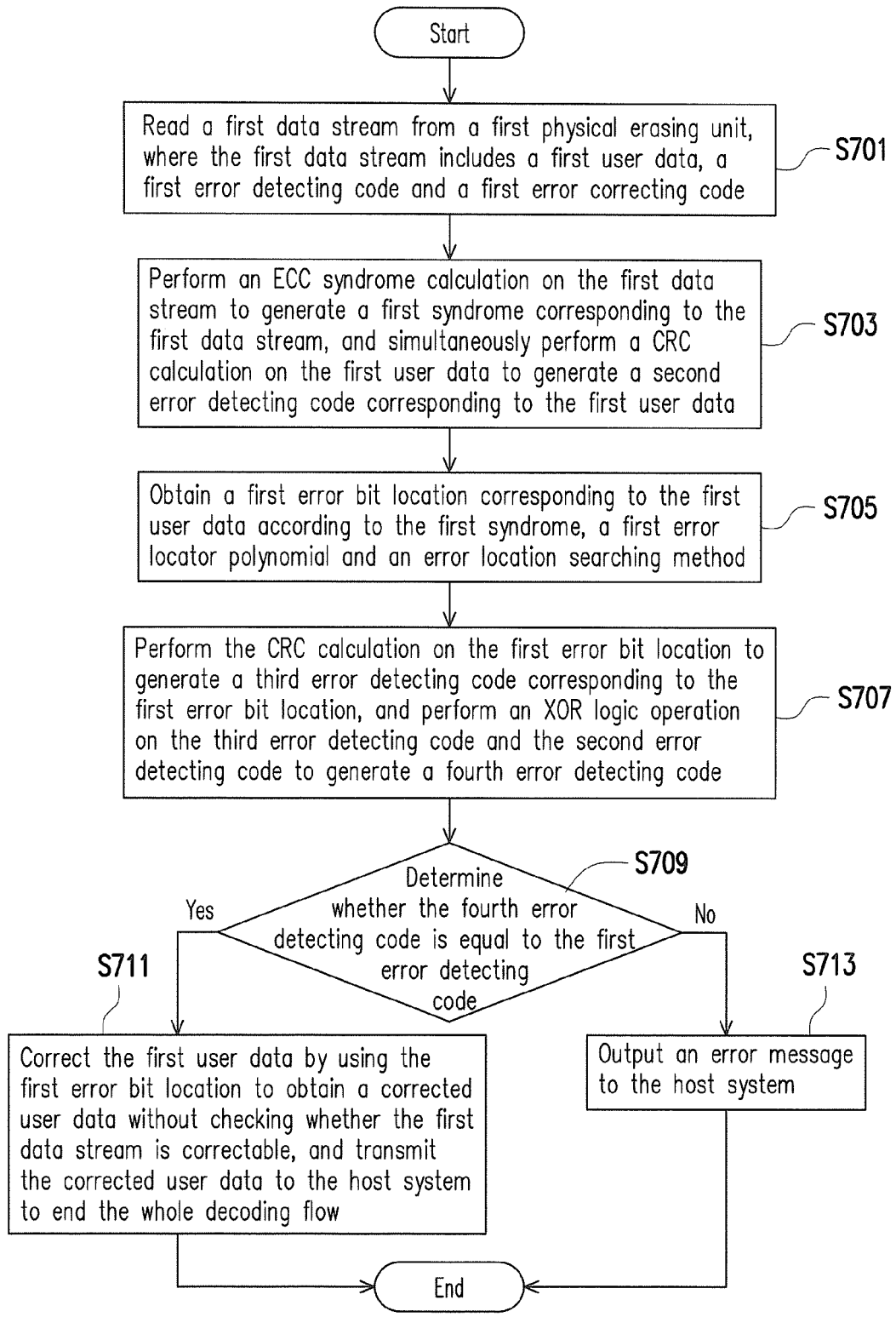
FIG. 7 is a flowchart illustrating a data managing method according to an exemplary embodiment.

FIG. 7 is a flowchart illustrating a data managing method according to an exemplary embodiment.

Referring to FIG. 7, in step S701, the memory managing circuit 202 (or the memory control circuit unit 104) reads a first data stream from a first physical erasing unit, where the first data stream includes first user data, a first error detecting code and a first error correcting code. Then, in step S703, the memory managing circuit 202 (or the memory control circuit unit 104) performs an ECC syndrome calculation on the first data stream to generate a first syndrome corresponding to the first data stream, and simultaneously performs a CRC calculation on the first user data to generate a second error detecting code corresponding to the first user data. It should be noticed that in the present exemplary embodiment, the first syndrome and the second error detecting code can be processed in parallel, so as to improve a calculation efficiency.

Then, in step S705, the memory managing circuit 202 (or the memory control circuit unit 104) obtains a first error bit location corresponding to the first user data according to the first syndrome, a first error locator polynomial and an error location searching rule. Then, in step S707, the memory managing circuit 202 (or the memory control circuit unit 104) performs the CRC calculation on the first error bit location to generate a third error detecting code corresponding to the first error bit location, and performs an XOR logic operation on the third error detecting code and the second error detecting code to generate a fourth error detecting code. In step S709, the memory managing circuit 202 (or the memory control circuit unit 104) determines whether the fourth error detecting code is equal to the first error detecting code.

If the fourth error detecting code is equal to the first error detecting code, in step S711, the memory managing circuit 202 (or the memory control circuit unit 104) corrects the first user data by using the first error bit location to obtain corrected user data without checking whether the first data stream is correctable, and transmits the corrected user data to the host system to end the whole decoding flow. If the fourth error detecting code is not equal to the first error detecting code, in step S713, the memory managing circuit 202 (or the memory control circuit unit 104) outputs an error message to the host system to end the whole decoding flow.

Figure 8:
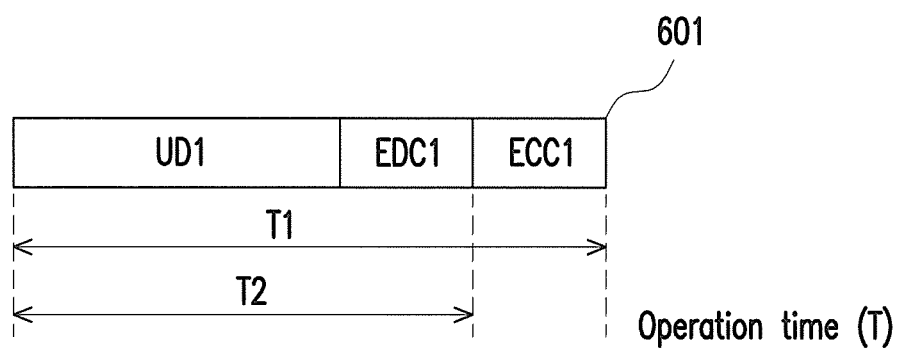
FIG. 8 is a comparison diagram of operation time required for processing data according to an exemplary embodiment.

FIG. 8 is a comparison diagram of operation time required for processing data according to an exemplary embodiment.

In the exemplary embodiment of the invention, after only executing the CS method of the first user data UD1 and the first error detecting code EDC1, the operation of correcting the first user data is started. Referring to FIG. 8, T1 is an operation time required by the memory managing circuit 202 (or the memory control circuit unit 104) for executing the CS method for the whole first data stream 601, and T2 is an operation time required by the memory managing circuit 202 (or the memory control circuit unit 104) for executing the CS method only for the first user data UD1 and the first error detecting code EDC1, and T2 is smaller than T1. Namely, in the exemplary embodiment, since only the CS method of the first user data UD1 and the first error detecting code EDC1 is executed, the operation time for executing the CS method is decreased, such that the whole operation time of the error correction is decreased.

In summary, besides that the error detecting code is used to strengthen data protection, when it is determined that the decoded data is correct by using the error detecting code, the decoding flow of the whole error correcting code can be ended in advance without checking whether the first data stream is correctable, by which a decoding speed is accelerated to enhance a data reading efficiency. The previously described exemplary embodiments of the present invention have the advantages aforementioned, wherein the advantages aforementioned not required in all versions of the invention.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A data managing method for a rewritable non-volatile memory module, wherein the rewritable non-volatile memory module comprises a plurality of physical erasing units and a plurality of logic units for mapping to at least a part of the physical erasing units, the data managing method comprising:
   receiving a first reading command from a host system, wherein the first reading command indicates to read data from a first logic unit among the logic units, and the first logic unit is mapped to a first physical erasing unit among the physical erasing units;
   reading a first data stream from the first physical erasing unit, wherein the first data stream comprises first user data, a first error detecting code and a first error correcting code;
   using the first error detecting code, the first error correcting code and the first user data to perform a first decoding procedure, wherein the first decoding procedure comprises:
      performing an error correcting code syndrome calculation on the first data stream to generate a first syndrome corresponding to the first data stream;
      performing a cyclic redundancy check calculation on the first user data to generate a second error detecting code corresponding to the first user data;
      generating a first error locator polynomial corresponding to the first data stream according to the first syndrome and calculating a first error bit number of the first data stream;
      obtaining the first error bit location corresponding to the first user data according to the first syndrome, the first error locator polynomial and an error location searching rule;
      performing the cyclic redundancy check calculation on the first error bit location to generate a third error detecting code corresponding to the first error bit location;
      performing an XOR logic operation on the third error detecting code and the second error detecting code to generate a fourth error detecting code;
      determining whether the fourth error detecting code is equal to the first error detecting code; and
      stopping the first decoding procedure if the fourth error detecting code is equal to the first error detecting code, and correcting the first user data to obtain the corrected user data by using the first error bit location checking whether the first data stream is correctable, and transmitting the corrected user data to the host system, and identifying the first user data to be successfully decoded; and
      outputting an error message to the host system if the fourth error detecting code is not equal to the first error detecting code; and
   transmitting corrected user data obtained by successfully decoding the first user data to the host system in response to the first reading command if the first user data is successfully decoded.

2. The data managing method as claimed in claim 1, wherein after the step of generating the first error locator polynomial corresponding to the first data stream according to the first syndrome and calculating the first error bit number of the first data stream, the method further comprises determining whether the first error bit number is greater than a predetermined error bit threshold first; and
   correcting the first user data by using the first error bit location to obtain the corrected user data after checking that the first data stream is correctable if the first error bit number is greater than the predetermined error bit threshold, and transmitting the corrected user data to the host system.

3. The data managing method as claimed in claim 2, wherein the step of correcting the first user data by using the first error bit location after checking that the first data stream is correctable comprises:
   obtaining a second error bit location corresponding to the first data stream according to the first syndrome, the first error locator polynomial and the error location searching rule after the step of generating the first error locator polynomial corresponding to the first data stream according to the first syndrome and calculating the first error bit number of the first data stream, wherein the second error bit location comprises the first error bit location;
   calculating a second error bit number according to the second error bit location;
   determining whether the second error bit number is equal to the first error bit number; and
   identifying that the first data stream is correctable if the second error bit number is equal to the first error bit number, and generating the corrected user data according to the first user data and the first error bit location.

4. The data managing method as claimed in claim 1, wherein before the step of transmitting the corrected user data to the host system, the method further comprises:
   performing the cyclic redundancy check calculation on the corrected user data to generate a fifth error detecting code corresponding to the corrected user data;
   determining whether the fifth error detecting code is equal to the first error detecting code;
   transmitting the corrected user data to the host system if the fifth error detecting code is equal to the first error detecting code; and
   outputting the error message to the host system if the fifth error detecting code is not equal to the first error detecting code.

5. A memory control circuit unit, for controlling a rewritable non-volatile memory module, the memory control circuit unit comprises:
   a host interface configured to couple to a host system;
   a memory interface configured to couple to the rewritable non-volatile memory module, wherein the rewritable non-volatile memory module has a plurality of physical erasing units; and
   a memory managing circuit, coupled to the host interface and the memory interface, and configured to configures a plurality of logic units for mapping to at least a part of the physical erasing units, wherein the memory managing circuit receives a first reading command from the host system, wherein the first reading command indicates to read data from a first logic unit among the logic units, and the first logic unit is mapped to a first physical erasing unit among the physical erasing units, wherein the memory managing circuit sends a command sequence to read a first data stream from the first physical erasing unit, wherein the first data stream comprises first user data, a first error detecting code and a first error correcting code, wherein the memory managing circuit performs a first decoding procedure by using the first error detecting code, the first error correcting code and the first user data, and in the first decoding procedure, wherein the memory managing circuit performs an error correcting code syndrome calculation on the first data stream to generate a first syndrome corresponding to the first data stream, and performs a cyclic redundancy check calculation on the first user data to generate a second error detecting code corresponding to the first user data, generates a first error locator polynomial corresponding to the first data stream according to the first syndrome and calculates a first error bit number of the first data stream, obtains the first error bit location corresponding to the first user data according to the first syndrome, the first error locator polynomial and an error location searching rule, performs the cyclic redundancy check calculation on the first error bit location to generate a third error detecting code corresponding to the first error bit location, performs an XOR logic operation on the third error detecting code and the second error detecting code to generate a fourth error detecting code, and determines whether the fourth error detecting code is equal to the first error detecting code, wherein the memory managing circuit stops the first decoding procedure if the fourth error detecting code is equal to the first error detecting code, and corrects the first user data to obtain the corrected user data by using the first error bit location checking whether the first data stream is correctable, and transmits the corrected user data to the host system, and identifies that the first user data is successfully decoded, wherein the memory managing circuit outputs an error message to the host system if the fourth error detecting code is not equal to the first error detecting code, and wherein if the first user data is successfully decoded, the memory managing circuit transmits corrected user data obtained by successfully decoding the first user data to the host system in response to the first reading command.

6. The memory control circuit unit as claimed in claim 5, wherein after the memory managing circuit generates the first error locator polynomial corresponding to the first data stream according to the first syndrome and calculates the first error bit number of the first data stream, the memory managing circuit determines whether the first error bit number is greater than a predetermined error bit threshold, wherein if the first error bit number is greater than the predetermined error bit threshold, the memory managing circuit corrects the first user data by using the first error bit location to obtain the corrected user data after checking that the first data stream is correctable, and transmits the corrected user data to the host system.

7. The memory control circuit unit as claimed in claim 6, wherein after the memory managing circuit generates the first error locator polynomial corresponding to the first data stream according to the first syndrome and calculates the first error bit number of the first data stream, the memory managing circuit obtains a second error bit location corresponding to the first data stream according to the first syndrome, the first error locator polynomial and the error location searching rule, wherein the second error bit location comprises the first error bit location, wherein the memory managing circuit calculates a second error bit number according to the second error bit location, wherein the memory managing circuit determines whether the second error bit number is equal to the first error bit number, wherein if the second error bit number is equal to the first error bit number, the memory managing circuit identifies that the first data stream is correctable, and generates the corrected user data according to the first user data and the first error bit location.

8. The memory control circuit unit as claimed in claim 5, wherein before the memory managing circuit transmits the corrected user data to the host system, the memory managing circuit performs the cyclic redundancy check calculation on the corrected user data to generate a fifth error detecting code corresponding to the corrected user data, wherein the memory managing circuit determines whether the fifth error detecting code is equal to the first error detecting code, wherein if the fifth error detecting code is equal to the first error detecting code, the memory managing circuit transmits the corrected user data to the host system, if the fifth error detecting code is not equal to the first error detecting code, the memory managing circuit outputs the error message to the host system.

9. A memory storage apparatus, comprising:

a connection interface unit configured to couple to a host system;

a rewritable non-volatile memory module, having a plurality of physical erasing units; and a memory control circuit unit, coupled to the connection interface unit and the rewritable non-volatile memory module, and is configured to configure a plurality of logic units for mapping to at least a part of the physical erasing units, wherein the memory control circuit unit receives a first reading command from the host system, wherein the first reading command indicates to read data from a first logic unit among the logic units, and the first logic unit is mapped to a first physical erasing unit among the physical erasing units, the memory control circuit unit reads a first data stream from the first physical erasing unit, wherein the first data stream comprises first user data, a first error detecting code and a first error correcting code, wherein the memory control circuit unit performs a first decoding procedure by using the first error detecting code, the first error correcting code and the first user data, and in the first decoding procedure, the memory control circuit unit performs an error correcting code syndrome calculation on the first data stream to generate a first syndrome corresponding to the first data stream, performs a cyclic redundancy check calculation on the first user data to generate a second error detecting code corresponding to the first user data, generates a first error locator polynomial corresponding to the first data stream according to the first syndrome, calculates a first error bit number of the first data stream, obtains the first error bit location corresponding to the first user data according to the first syndrome, the first error locator polynomial and an error location searching rule, performs the cyclic redundancy check calculation on the first error bit location to generate a third error detecting code corresponding to the first error bit location, performs an XOR logic operation on the third error detecting code and the second error detecting code to generate a fourth error detecting code, and determines whether the fourth error detecting code is equal to the first error detecting code, wherein the memory control circuit unit stops the first decoding procedure if the fourth error detecting code is equal to the first error detecting code, and corrects the first user data to obtain the corrected user data by using the first error bit location without checking whether the first data stream is correctable, and transmits the corrected user data to the host system, and identifies that the first user data is successfully decoded, wherein the memory control circuit unit outputs an error message to the host system if the fourth error detecting code is not equal to the first error detecting code, and wherein if the first user data is successfully decoded, the memory control circuit unit transmits corrected user data obtained by successfully decoding the first user data to the host system in response to the first reading command.

10. The memory storage apparatus as claimed in claim 9, wherein after the memory control circuit unit generates the first error locator polynomial corresponding to the first data stream according to the first syndrome and calculates the first error bit number of the first data stream, the memory control circuit unit determines whether the first error bit number is greater than a predetermined error bit threshold, wherein if the first error bit number is greater than the predetermined error bit threshold, the memory control circuit unit corrects the first user data by using the first error bit location to obtain the corrected user data after checking that the first data stream is correctable, and transmits the corrected user data to the host system.

11. The memory storage apparatus as claimed in claim 10, wherein after the memory control circuit unit generates the first error locator polynomial corresponding to the first data stream according to the first syndrome and calculates the first error bit number of the first data stream, the memory control circuit unit obtains a second error bit location corresponding to the first data stream according to the first syndrome, the first error locator polynomial and the error location searching rule, wherein the second error bit location comprises the first error bit location, wherein the memory control circuit unit calculates a second error bit number according to the second error bit location, wherein the memory control circuit unit determines whether the second error bit number is equal to the first error bit number, wherein if the second error bit number is equal to the first error bit number, the memory control circuit unit identifies that the first data stream is correctable, and generates the corrected user data according to the first user data and the first error bit location.

12. The memory storage apparatus as claimed in claim 9, wherein before the memory control circuit unit transmits the corrected user data to the host system, the memory control circuit unit performs the cyclic redundancy check calculation on the corrected user data to generate a fifth error detecting code corresponding to the corrected user data, wherein the memory control circuit unit determines whether the fifth error detecting code is equal to the first error detecting code, wherein if the fifth error detecting code is equal to the first error detecting code, the memory control circuit unit transmits the corrected user data to the host system, when the fifth error detecting code is not equal to the first error detecting code, the memory control circuit unit outputs the error message to the host system.

* * * * *